United States Patent
Liu et al.

(10) Patent No.: US 9,141,158 B2
(45) Date of Patent: Sep. 22, 2015

(54) NOTEBOOK COMPUTER

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Lei Liu, Shenzhen (CN); Guo-Yi Chen, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 260 days.

(21) Appl. No.: 13/706,355

(22) Filed: Dec. 6, 2012

(65) Prior Publication Data

US 2014/0146460 A1    May 29, 2014

(30) Foreign Application Priority Data

Nov. 23, 2012    (CN) .......................... 2012 1 0480660

(51) Int. Cl.
G06F 1/20    (2006.01)
H05K 7/20    (2006.01)
G09G 3/28    (2013.01)

(52) U.S. Cl.
CPC . *G06F 1/203* (2013.01); *G06F 1/20* (2013.01); *G09G 3/28* (2013.01); *H05K 7/20* (2013.01)

(58) Field of Classification Search
CPC ............. G06F 1/203; G06F 1/16; G06F 1/20; H05K 7/20; H04N 7/00; G09G 3/28
USPC .................. 361/679.26, 679.48, 679.55, 695; 348/552; 345/60
See application file for complete search history.

(56) References Cited

U.S. PATENT DOCUMENTS

| | | | |
|---|---|---|---|
| 6,181,555 B1 * | 1/2001 | Haley et al. | 361/679.21 |
| 7,580,258 B2 * | 8/2009 | Tseng et al. | 361/690 |
| 2006/0290812 A1 * | 12/2006 | Hsu | 348/552 |
| 2008/0218446 A1 * | 9/2008 | Yamanaka | 345/60 |
| 2009/0175002 A1 * | 7/2009 | Tseng et al. | 361/694 |

* cited by examiner

*Primary Examiner* — Anthony Haughton
*Assistant Examiner* — Matt Dhillon
(74) *Attorney, Agent, or Firm* — Novak Druce Connolly Bove + Quigg LLP

(57) ABSTRACT

A notebook computer includes a base, a display, a bracket, and a fan. The display is rotatably connected to a rear side of the base and defines a number of heat dissipation holes in an outer surface of the display. The bracket is connected to the display and aligned with the heat dissipation holes. The fan is fastened to the bracket. An airflow inlet of the fan faces the heat dissipation holes, and an airflow outlet of the fan is opposite to the heat dissipation holes.

11 Claims, 5 Drawing Sheets

NOTEBOOK COMPUTER

BACKGROUND

1. Technical Field

The present disclosure relates to a notebook computer.

2. Description of Related Art

The notebook computer is popular with consumers for its portability. However, limited by the size, the effectiveness of heat dissipation of the notebook computer is not ideal.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
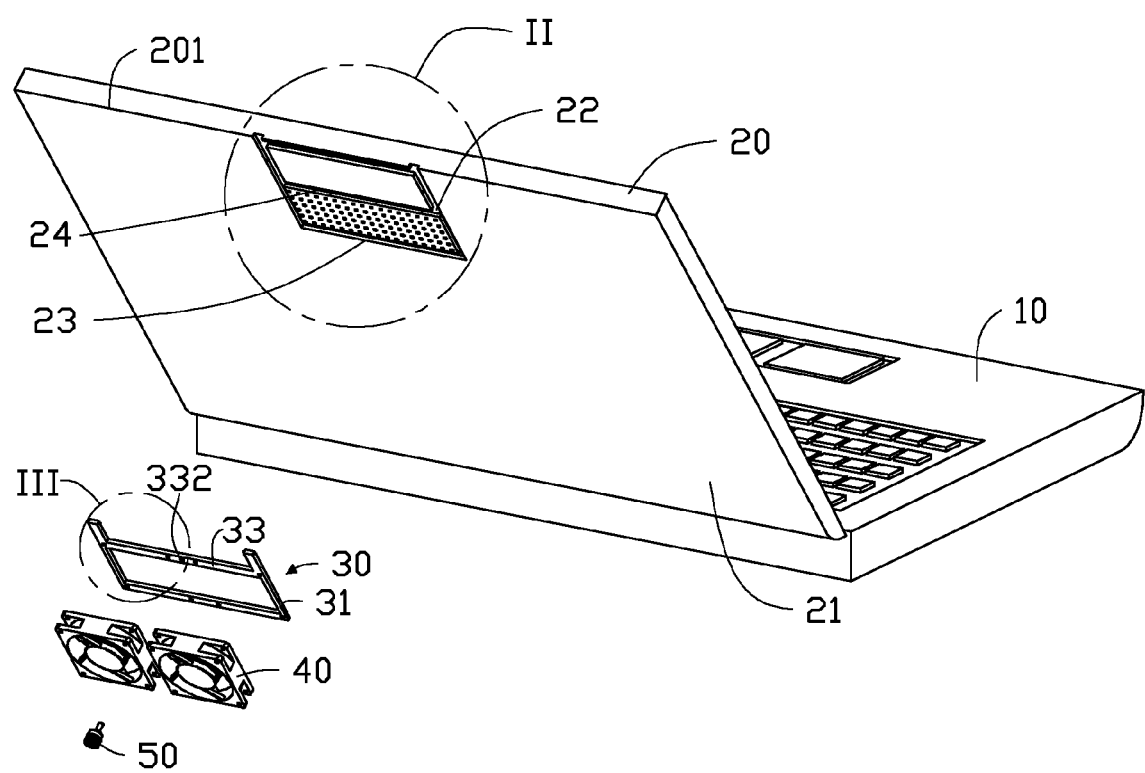
FIG. 1 is an exploded, isometric view of an exemplary embodiment of a notebook computer.
Figure 2:
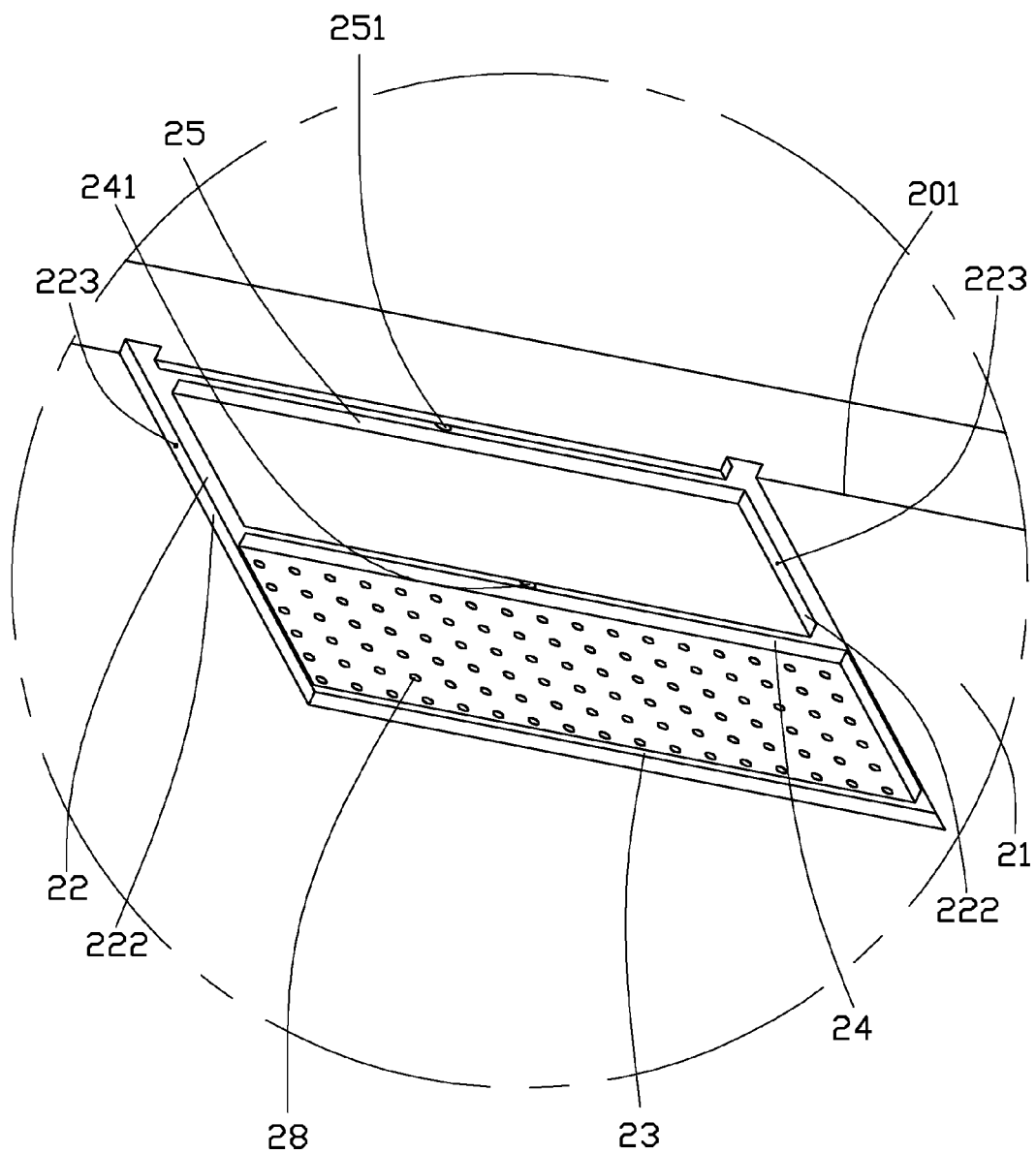
FIG. 2 is an enlarged view of a circled portion II of FIG. 1.

FIGS. 1 and 2 show an exemplary embodiment of a notebook computer. The notebook computer includes a base 10, a display 20 rotatably connected to a rear side of the base 10, a bracket 30, and two fans 40.

The display 20 includes an edge 201 away from the rear side of the base 10. An outer surface 21 of the display 20 defines two recesses 22 substantially perpendicular to and extending through the edge 201, a first slot 23 connected between ends of the recesses 22 opposite to the edge 201 in a substantially perpendicular manner, a second slot 24 connected between middles of the recesses 22 in a substantially perpendicular manner, and a third slot 25 connected between the recesses 22 in a substantially perpendicular manner and near the edge 201. Opposite sidewalls 222 of each recess 22 define two opposite mounting holes 223 located between the second slot 24 and third slot 25. A locking hole 241 is defined in a middle of a bottom wall of the second slot 24, and a locking hole 251 is defined in a middle of a bottom wall of the third slot 25. A plurality of heat dissipation holes 28 is defined in the outer surface 21 of the display 20, located among the recesses 22, the first slot 23, and the second slot 24. A part of hot airflow in the notebook computer flows out of the notebook computer through the heat dissipation holes 28.

Figure 3:
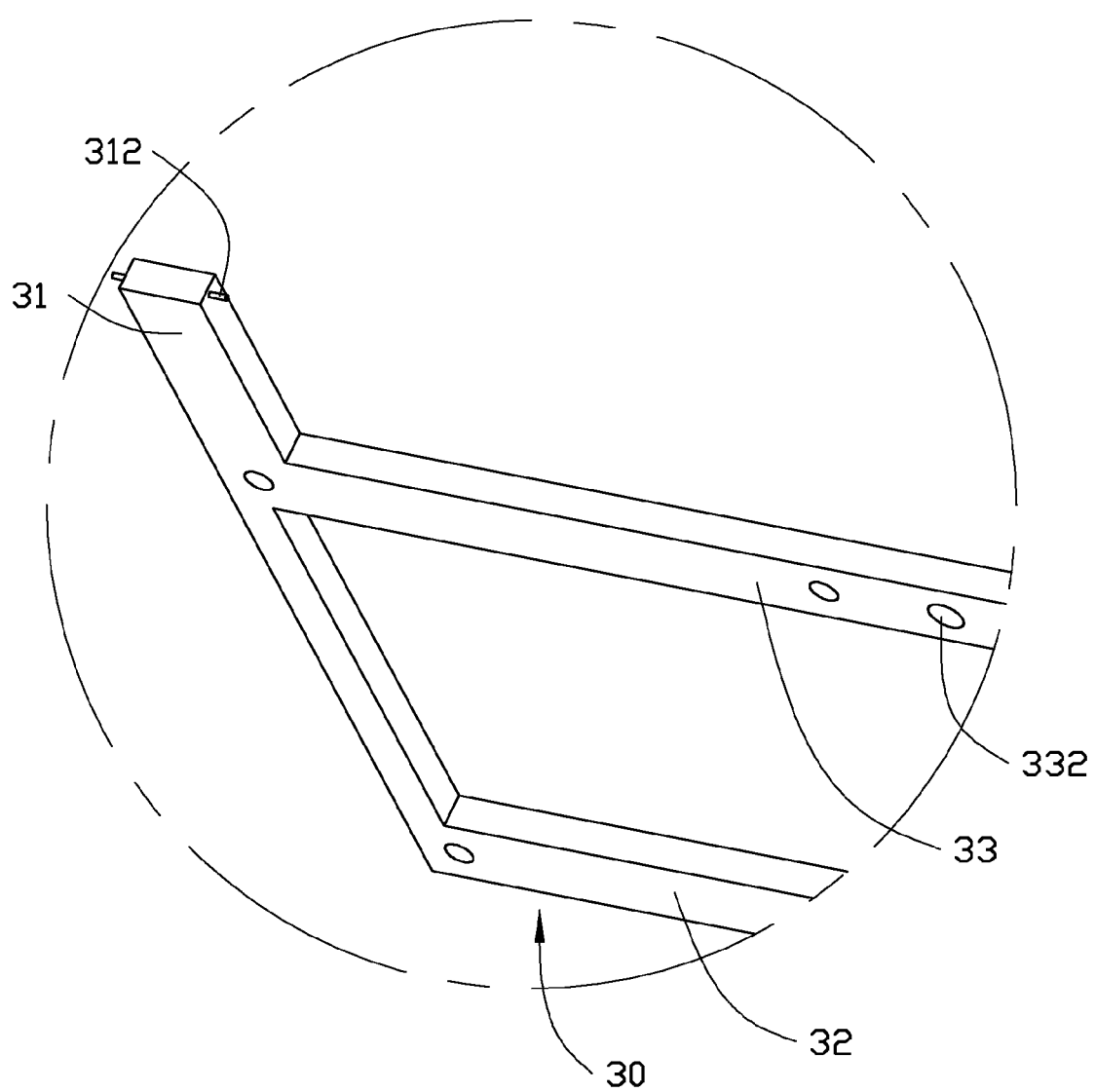
FIG. 3 is an enlarged view of a circled portion III of FIG. 1.

FIG. 3 shows the bracket 30 including two parallel pivoting poles 31, a first pole 32 connected between first ends of the pivoting poles 31 in a substantially perpendicular manner, and a second pole 33 connected between the pivoting poles 31 in a substantially perpendicular manner and near second ends of the pivoting poles 31. Two pins 312 protrude from opposite sides of the second end of each pivoting pole 31. A through hole 332 is defined in a middle of the second pole 33.

Figure 4:
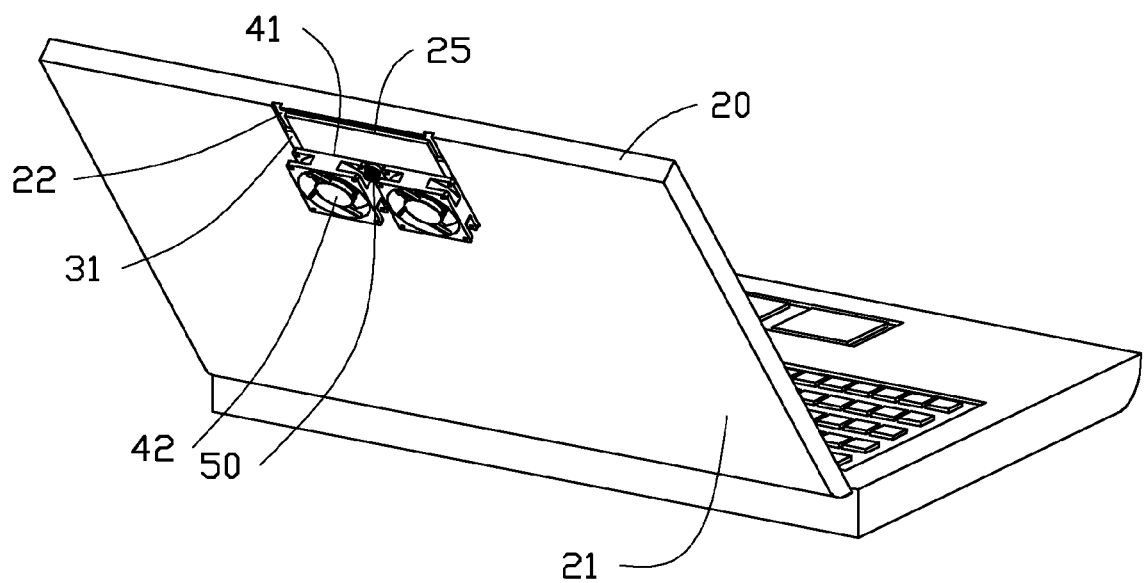
FIG. 4 is an assembled, isometric view of FIG. 1.

FIG. 4 shows that in assembly, the pins 312 of each pivoting pole 31 rotatably engage in the mounting holes 223 of the corresponding recess 22, to rotatably connect the bracket 30 to the display 20. The bracket 30 is rotated to allow the pivoting poles 31 to be respectively received in the recesses 22. The first pole 32 is received in the first slot 23, and the second pole 33 is received in the second slot 24. A fastener 50, such as a screw, extends through the through hole 332 and engages in the locking hole 241. The fans 40 are fastened to the first pole 32 and second pole 33 by screws. The fans 40 are located at opposite sides of the fastener 50 and aligned with the heat dissipation holes 28. The airflow inlets 41 of the fans 40 face the heat dissipation holes 28, and the airflow outlets 42 of the fans 40 are opposite to the heat dissipation holes 28. The hot airflow in the notebook computer speedily flows out of the notebook computer forced by the fans 40. The effectiveness of heat dissipation of the notebook computer is improved.

Figure 5:
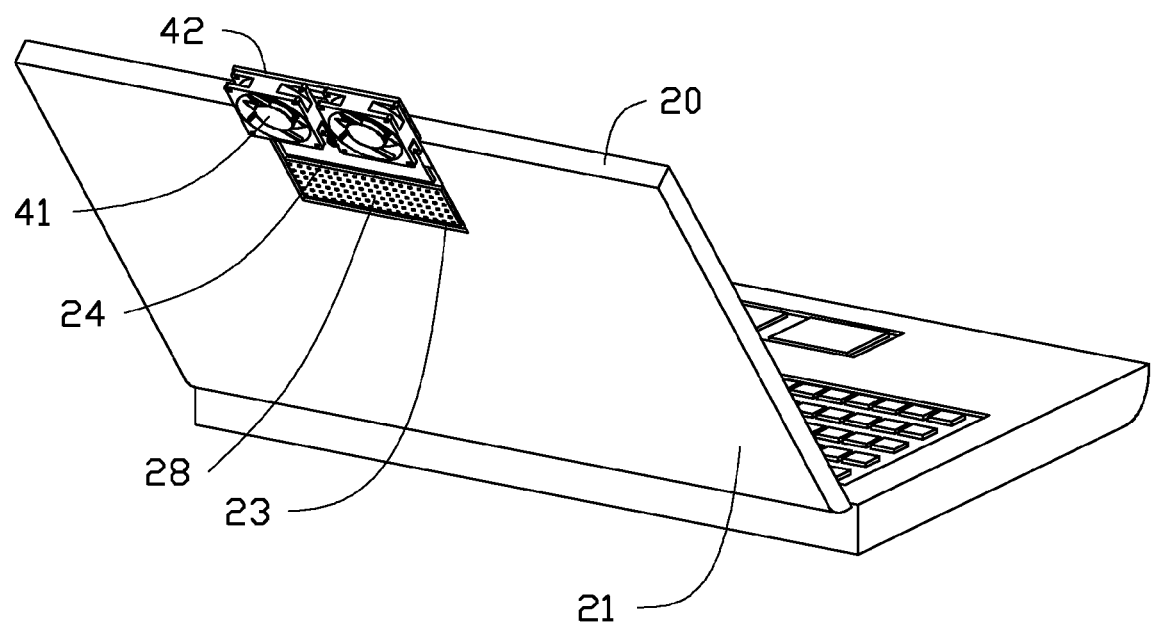
FIG. 5 is similar to FIG. 4, but showing another state of use.

FIG. 5 shows the fans 40 in another state of use. When the weather is hot, the fans 40 can supply cool airflow for the user of the notebook computer. The fastener 50 is released from the notebook computer and the bracket 30. The fans 50 are detached from the bracket 30. The bracket 30 is rotated 180 degrees about the pins 312. The second pole 33 is received in the third slot 25. The first pole 32 and the pivoting poles 31 near the first pole 32 are located out of the display 20. The fastener 50 extends through the through hole 332 and engages in the locking hole 251. The fans 40 are fastened to the first pole 32 and the second pole 33, located at opposite sides of the fastener 50. The airflow inlets 41 of the fans 40 are opposite to the outer surface 21 of the display 20, and the airflow outlets 42 of the fans 40 face the outer surface 21 of the display 20. The display 20 is rotated a certain angle to allow the airflow outlets 42 of the fans 40 to face the user of the notebook computer, to supply cool airflow for the user.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A notebook computer, comprising:
   a base;
   a display rotatably connected to a rear side of the base, and defining a plurality of heat dissipation holes in an outer surface of the display opposite to the base;
   a bracket connected to the outer surface of the display and aligned with the heat dissipation holes; and
   a fan fastened to the bracket, an airflow inlet of the fan facing the heat dissipation holes, an airflow outlet of the fan opposite to the heat dissipation holes.

2. The notebook computer of claim 1, wherein the bracket comprises a first pole and a second pole parallel to the first pole, the fan is fastened to the first pole and second pole.

3. The notebook computer of claim 2, wherein the outer surface of the display defines a first slot to receive the first pole, and a second slot to receive the second pole.

4. The notebook computer of claim 3, wherein the display comprises an edge away from the rear side of the base, the outer surface of the display defines two recesses substantially perpendicular to and extending through the edge, the first slot is connected between ends of the recesses away from the edge in a substantially perpendicular manner, the second slot is connected between middles of the recesses in a substantially perpendicular manner, the bracket further comprises two pivoting poles respectively received in the recesses, the first pole and second pole both connected between the pivoting poles, an end of each pivoting pole is rotatably connected to the display in the corresponding recess, a fastener extends through the second pole and engages in the second slot.

5. The notebook computer of claim 4, wherein opposite sidewalls of each recess define two opposite mounting holes, two pins protrude from each pivoting pole opposite to the first pole and rotatably engage in the mounting holes of the corresponding recess.

6. The notebook computer of claim 4, wherein the outer surface of the display defines a third slot connected between the recesses in a substantially perpendicular manner and near the edge, wherein the fan and the fastener are operable to be detached from the bracket and the bracket is operable to be rotated 180 degrees to receive the second pole in the third slot, the fastener extends through the second pole and engages in the third slot, the fan is fastened to the first pole and the second pole with the airflow outlet of the fan facing the display.

7. A notebook computer, comprising:
   a base;
   a display rotatably connected to a rear side of the base, and defining a plurality of heat dissipation holes in an outer surface of the display opposite to the base;
   a fan comprising an airflow inlet, and an airflow outlet opposite to the airflow inlet;
   a bracket mounting the fan, the bracket rotatably mounted to the outer surface of the display between a first fixed position where the airflow inlet of the fan faces and aligns with the heat dissipation holes, and a second fixed position where the fan is extended out of an edge of the display opposite to a junction of the base and the display, and the airflow inlet of the fan is opposite to the outer surface of the display.

8. The notebook computer of claim 7, wherein the bracket comprises two parallel pivoting poles, the outer surface of the display defines two parallel recesses perpendicular and extending through the edge of the display, the pivoting poles are respectively received in the recesses, and first ends of the pivoting poles are rotatably mounted to the display adjacent to the edge.

9. The notebook computer of claim 8, wherein the bracket further comprises a first pole connected between second ends of the pivoting poles, and a second pole connected between middles of the pivoting poles, the outer surface of the display further defines a first slot communicates ends of the recesses opposite to the edge of the display, and a second slot communicates with middles of the recesses, wherein in the first position of the bracket, the first slot receives the first pole and the second slot receives the second pole.

10. The notebook computer of claim 9, wherein the outer surface of the display further defines a third slot communicating with the recesses and adjacent to the edge of the display, wherein in the second position of the bracket, the bracket is rotated about 180 degrees, with the first pole separated from and located out of the display and the second pole received in the third slot.

11. The notebook computer of claim 10, wherein opposite sidewalls of each recess define two opposite mounting holes adjacent to the edge of the display, two opposite pins protrude from the first end of each pivoting pole and rotatably engage in the mounting holes of the corresponding recess.

* * * * *